(12) United States Patent
Ichihara et al.

(10) Patent No.: US 8,304,304 B2
(45) Date of Patent: Nov. 6, 2012

(54) SEMICONDUCTOR DEVICE

(75) Inventors: Reika Ichihara, Tokyo (JP); Yoshinori Tsuchiya, Yokohama (JP); Masato Koyama, Miura-gun (JP); Akira Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/184,116

(22) Filed: Jul. 15, 2011

(65) Prior Publication Data

US 2011/0275184 A1 Nov. 10, 2011

Related U.S. Application Data

(63) Continuation of application No. 11/841,817, filed on Aug. 20, 2007, now Pat. No. 8,053,300, which is a continuation of application No. 11/299,773, filed on Dec. 13, 2005, now Pat. No. 7,391,085.

(30) Foreign Application Priority Data

Feb. 14, 2005 (JP) ................................. 2005-036575

(51) Int. Cl.
*H01L 21/8238* (2006.01)
(52) U.S. Cl. ................. 438/199; 438/261; 257/E21.632
(58) Field of Classification Search .................. 438/197, 438/199, 230, 261, 287; 257/E21.632
See application file for complete search history.

(56) References Cited

U.S. PATENT DOCUMENTS

| 6,407,435 | B1 | 6/2002 | Ma et al. |
| 6,593,634 | B2 | 7/2003 | Ohmi et al. |
| 6,982,465 | B2 | 1/2006 | Kumagai et al. |
| 7,105,889 | B2 | 9/2006 | Bojarczuk et al. |
| 7,709,402 | B2 | 5/2010 | Ahn et al. |
| 2002/0135030 | A1 | 9/2002 | Horikawa |
| 2003/0160227 | A1 | 8/2003 | Misra et al. |
| 2004/0207023 | A1 | 10/2004 | Nishiyama et al. |
| 2005/0098839 | A1 | 5/2005 | Lee et al. |

(Continued)

FOREIGN PATENT DOCUMENTS

JP 2002-280461 9/2002

(Continued)

OTHER PUBLICATIONS

Yee-Chia, et al., "Effects of High-κ Gate Dielectric Materials on Metal and Silicon Gate Workfunctions", IEEE Electron Device Letters, vol. 23, No. 6, pp. 342-344, (Jun. 2002).

(Continued)

*Primary Examiner* — Hoai V Pham
(74) *Attorney, Agent, or Firm* — Finnegan, Henderson, Farabow, Garrett & Dunner, L.L.P.

(57) ABSTRACT

A semiconductor device includes a semiconductor substrate, an nMISFET formed on the substrate, the nMISFET including a first dielectric formed on the substrate and a first metal gate electrode formed on the first dielectric and formed of one metal element selected from Ti, Zr, Hf, Ta, Sc, Y, a lanthanoide and actinide series and of one selected from boride, silicide and germanide compounds of the one metal element, and a pMISFET formed on the substrate, the pMISFET including a second dielectric formed on the substrate and a second metal gate electrode formed on the second dielectric and made of the same material as that of the first metal gate electrode, at least a portion of the second dielectric facing the second metal gate electrode being made of an insulating material different from that of at least a portion of the first dielectric facing the first metal gate electrode.

22 Claims, 6 Drawing Sheets

U.S. PATENT DOCUMENTS

2005/0269634 A1 12/2005 Bojarczuk et al.
2006/0102968 A1* 5/2006 Bojarczuk et al. ............ 257/392

FOREIGN PATENT DOCUMENTS

| JP | 2004-214376 | 7/2004 |
| JP | 2004-228180 | 8/2004 |
| JP | 2004-289061 | 10/2004 |
| JP | 2008-511971 | 4/2008 |

OTHER PUBLICATIONS

Samavedam, et al., "Dual-Metal Gate CMOS with HfO$_2$ Gate Dielectric", IEEE, IEDM, pp. 1-3, (2002).

Narayanan, et al., "Dual Work Function Metal Gate CMOS using CVD metal electrodes", IEEE, Symposium on VLSI Technology, Digest of Technical Papers, pp. 192-193, (2004).

R. Ichihara et al., "Ta-based metal gates (Ta, TaB$_x$, TaN$_x$ and TaC$_x$)-Modulated Work Function and Improved Thermal Stability," Extended Abstracts of the 2005 International Conference on Solid State Devices and Materials (Sep. 13-15, 2005), pp. 850-851.

Notification of Reasons for Rejection mailed by the Japanese Patent Office on Apr. 21, 2009, for Japanese Application No. 2005-036575 with an English language translation.

* cited by examiner

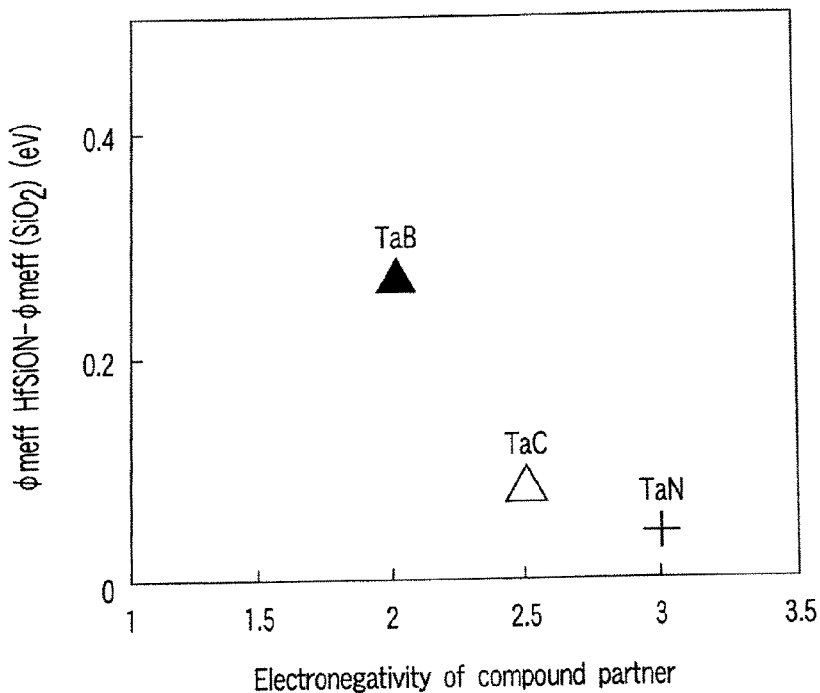
F I G. 5
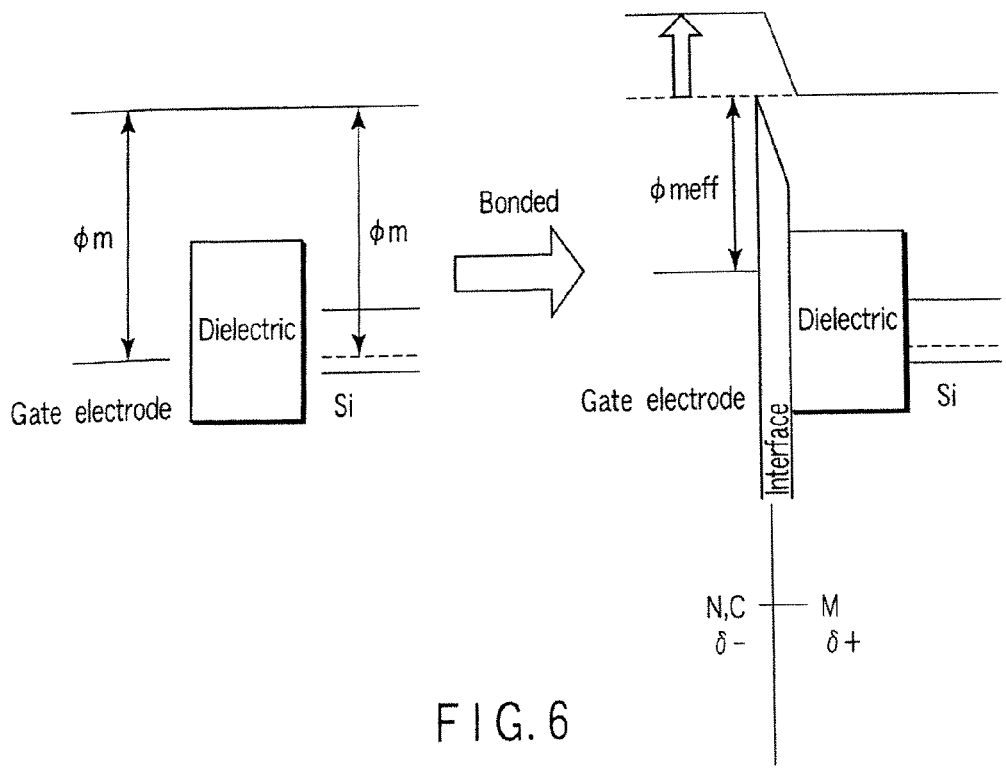
F I G. 6

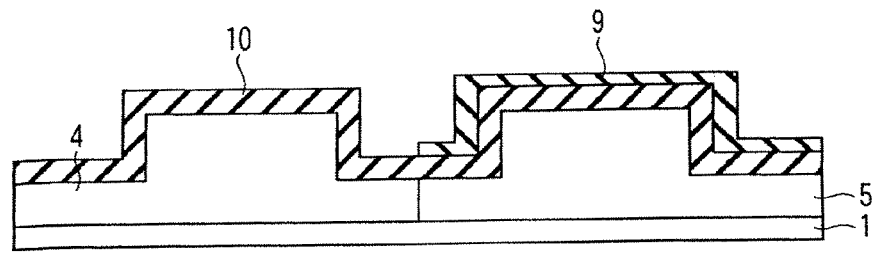
F I G. 11
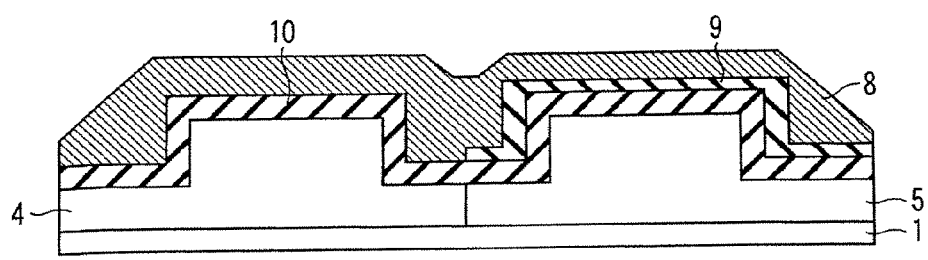
F I G. 12
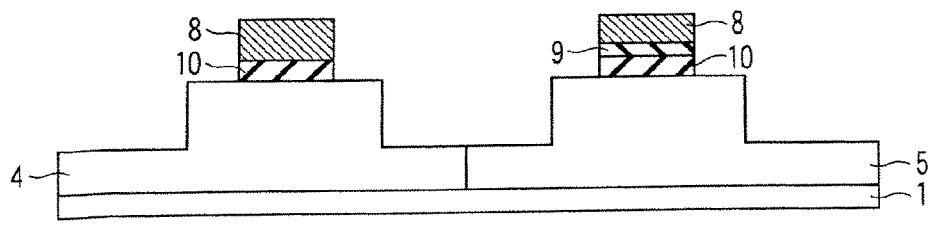
F I G. 13

SEMICONDUCTOR DEVICE

CROSS-REFERENCE TO RELATED APPLICATIONS

This is a continuation of application Ser. No. 11/841,817, filed Aug. 20, 2007 now U.S. Pat. No. 8,053,300, which is a continuation of application Ser. No. 11/299,773, filed Dec. 13, 2005, which issued as U.S. Pat. No. 7,391,085, the contents of all of which are incorporated herein by reference.

This application is based upon and claims the benefit of priority from prior Japanese Patent Application No. 2005-036575, filed Feb. 14, 2005, the entire contents of which are incorporated herein by reference.

BACKGROUND OF THE INVENTION

1. Field of the Invention

The present invention relates to a semiconductor device, and more particularly to a structure of a CMIS semiconductor device using a metal gate electrode.

2. Description of the Related Art

As miniaturization of MISFETs progresses to improve integration and performance of semiconductor devices, it is necessary to reduce a thickness of a gate dielectric (insulating film). However, in a complementary metal-insulator-semiconductor (CMIS) device in which gate length is 50 nm or less, performance improvement is no longer achieved when a conventional polysilicon gate electrode is used. This is because the equivalent $SiO_2$ thickness of the gate dielectric is 2 nm or less in this technical generation and a reduction of gate capacitance becomes obvious due to interfacial depletion of the polysilicon gate electrode. The depletion of the gate electrode is reduced by increasing charge density of the electrode, but the impurity concentration in Si is about $2\times10^{20}$ $cm^{-3}$ at the maximum, and a capacitance reduction corresponding to 0.5 nm in the equivalent $SiO_2$ thickness is also caused in this case. This capacitance reduction will be a serious problem in a CMIS technique generation in which the dielectric thickness is 2 nm or less.

Thus, attention is focused on a metal gate technique using a metal as a gate electrode material. Since the metal has high charge density substantially equal to the atomic density, the depletion of the metal gate electrode can be neglected when metal is used as the gate electrode. For the above reasons, it is considered that the introduction of the metal gate electrode will be essential in the CMIS device in the future.

In order to achieve a low threshold voltage in the CMIS device using the metal gate electrode, the work function of the metal which is the gate electrode needs to be about 3.9 to 4.4 eV in an nMISFET and about 4.7 to 5.2 eV in a pMISFET.

Heretofore, means for satisfying this condition has generally been a method which uses different metals for the nMISFET and the pMISFET, and it has been reported that Ti, Ta, TaSiN, Al and the like have a work function suited to the nMISFET and that Mo, Ni, Pt, Ru, $RO_2$, $IrO_2$, TiAlN, TaAlN and the like have a work function suited to the pMISFET (e.g., refer to V. Narayanan VLSI 2004 192 or S. B. Samavedam et at., IEDM 2002 433).

However, when the gate electrodes of the nMISFET and the pMISFET are formed of different metals, it is necessary to individually produce the gate electrodes, which causes the problem that the manufacturing process is complicated and manufacturing costs increase.

At present, methods of individually producing the gate electrodes in an nMISFET and pMISFET include solid phase diffusion, ion implantation, alloying, and total silicidation. However, there are few combinations of metals which can be formed by these methods and which satisfy an optimum condition for the work function of the nMISFET and the pMISFET described above, and in the present circumstances, no metal gate technique is established which facilitates integration in terms of the manufacturing process.

As described above, the gate electrodes of an nMISFET and pMISFET have been formed of different metals in order to introduce the metal gate technique which will be essential in the future, and therefore, there has heretofore been the problem that the manufacturing process is complicated. Thus, it has been desired to realize a CMIS semiconductor device which has the same metal gate for an nMISFET and pMISFET and which makes integration easy.

BRIEF SUMMARY OF THE INVENTION

According to a first aspect of the invention, there is provided a semiconductor device which comprises:

a semiconductor substrate;

an nMISFET formed on the semiconductor substrate, the nMISFET including a first dielectric formed on the semiconductor substrate and a first metal gate electrode formed on the first dielectric, the first metal electrode being formed of one metal element selected from the group consisting of Ti, Zr, Hf, Ta, Sc, Y, a lanthanoide series, and a actinide series and of one selected from the group consisting of boride, silicide and germanide compounds of the one metal element; and a pMISFET formed on the semiconductor substrate, the pMISFET including a second dielectric formed on the semiconductor substrate and a second metal gate electrode formed on the second dielectric and made of the same material as that of the first metal gate electrode, at least a portion of the second dielectric facing the second metal gate electrode being made of an insulating material different from that of at least a portion of the first dielectric facing the first metal gate electrode.

According to a second aspect of the invention, there is provided a semiconductor device which comprises:

a semiconductor substrate;

an nMISFET formed on the semiconductor substrate, the nMISFET including a first dielectric formed on the semiconductor substrate and a first metal gate electrode formed on the first dielectric; and a pMISFET formed on the semiconductor substrate, the pMISFET including a second dielectric formed on the semiconductor substrate and a second metal gate electrode formed on the second dielectric and made of the same material as that of the first metal gate electrode, at least a portion of the second dielectric facing the second metal gate electrode being made of an insulating material different from that of at least a portion of the first dielectric facing the first metal gate electrode, wherein a relation:

$$(\chi B - \chi A) \times (d_A + d_B) \geq 3.9$$

is satisfied by electronegativity ($\chi A$) and an atomic radius ($d_A$, a unit thereof is Å) of a metal element constituting the first metal gate electrode and the second metal gate electrode and by electronegativity ($\chi B$) and an atomic radius ($d_B$) of an element having the highest binding energy to combine with the metal element constituting the second metal electrode among elements constituting the portion of the second dielectric of the pMISFET facing the second metal electrode.

BRIEF DESCRIPTION OF THE SEVERAL VIEWS OF THE DRAWING

FIG. 5 is a graph to explain electronegativity dependency of a compound partner relative to a difference of the effective work function of the Ta compounds on HfSiON and SiO$_2$;

FIG. 6 is an energy band diagram when the dipole is formed at the interface between the gate electrode and the gate dielectric;

FIGS. 10 to 13 are sectional views showing stepwise a manufacturing process of the semiconductor device according to the second embodiment;

DETAILED DESCRIPTION OF THE INVENTION

According to embodiments of the present invention described from now on, it is possible to realize a dual work function CMIS semiconductor device using the same metal gate electrode for a pMISFET and an nMISFET. Further, as compared with a case where different metals are used for the pMISFET and the nMISFET, it is not necessary to individually produce the gate electrodes for the pMISFET and the nMISFET, and gate processing steps are simplified, thereby making it possible to realize the CMIS semiconductor device using a metal gate and making integration easy.

The embodiments of the present invention will hereinafter be described with reference to the drawings.

(First Embodiment)

Figure 1:
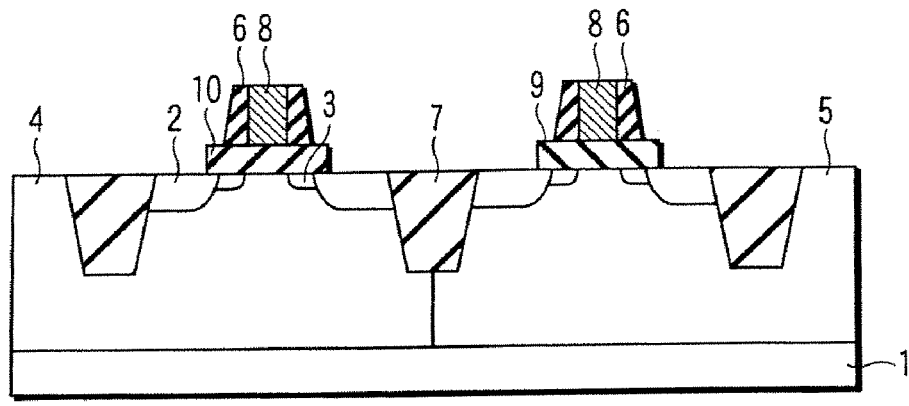
FIG. 1 is a sectional view of a semiconductor device according to a first embodiment of the present invention.

FIG. 1 is a sectional view of a semiconductor device according to a first embodiment of the present invention. In a surface region of an Si substrate as a semiconductor substrate, there are provided an n-type semiconductor region 4 and a p-type semiconductor region 5, and a pMISFET and an nMISFET are formed in the respective regions. The n-type, p-type semiconductor regions 4, 5 are formed as so-called wells.

On a surface of the n-type semiconductor region 4, a gate dielectric (insulating film) is formed which is made of an oxide 10 containing a metal atom having lower binding energy to combine with a metal atom of a gate electrode 8 than Al, Si and Ge. The metal atoms are, for example, Zr, Hf, Ti, Ta, Nb, V, Sc, Y, and a lanthanoide and actinide series.

On a surface of the p-type semiconductor region 5, a dielectric 9 different from the gate dielectric 10 is formed which includes any one of Al, Si and Ge having high binding energy to combine with the metal atoms of the gate electrode 8. The gate dielectric 9 is, for example, AlN, AlON, Al$_2$O$_3$, SiO$_2$, SiN, SiON, HfSiON, GeO$_2$, or GeON.

On the gate dielectric 9 and the gate dielectric 10, the gate electrode 8 is formed which is made of any one of Ti, Zr, Hf, Ta, Sc, Y and a lanthanoide and actinide series or a boride, silicide or germanide compound of these metals. A refractory metal such as W or the like may further be formed on the gate electrode 8. It is to be noted that an isolation region 7, a source/drain region 2, an extension region 3 and a sidewall dielectric 6 which are other components in FIG. 1 can be formed in an ordinary semiconductor process.

Figure 2:
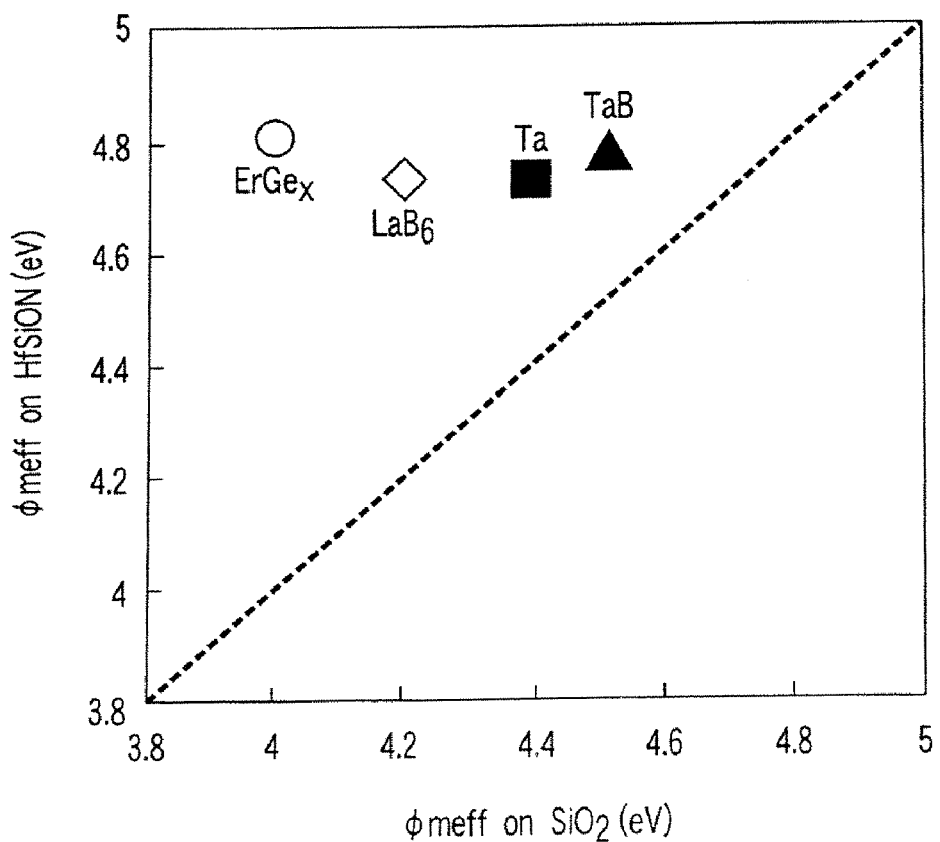
FIG. 2 is a graph showing an effective work function on HfSiON and SiO$_2$ of a metal gate electrode.

FIG. 2 shows an effective work function φmeff of the metal gate electrode when HfSiON which is a high-k dielectric is used as the gate dielectric 10 and SiO$_2$ is used as the gate dielectric 9.

The metal gate electrode is made of any one of ErGe$_x$ (0<x<1), LaB$_6$, Ta and TaB. In all the metal electrodes, an effective work function of about 4 to 4.5 eV suited to the nMISFET is shown on SiO$_2$, and an effective work function of about 4.7 to 4.8 eV suited to the pMISFET is shown on HfSiON. That is, in accordance with this combination of materials, it is possible to realize a dual-work function CMIS using a single metal as the gate electrode.

A phenomenon in which the effective work function of the metal electrode thus varies depending on the kind of gate dielectric occurs due to the following reasons: the atom in the dielectric combines with the atom in the metal electrode at an interface between the metal electrode and the dielectric, and the effective work function is modulated by a dipole formed due to a difference of electronegativities in the respective atoms.

Figure 3:
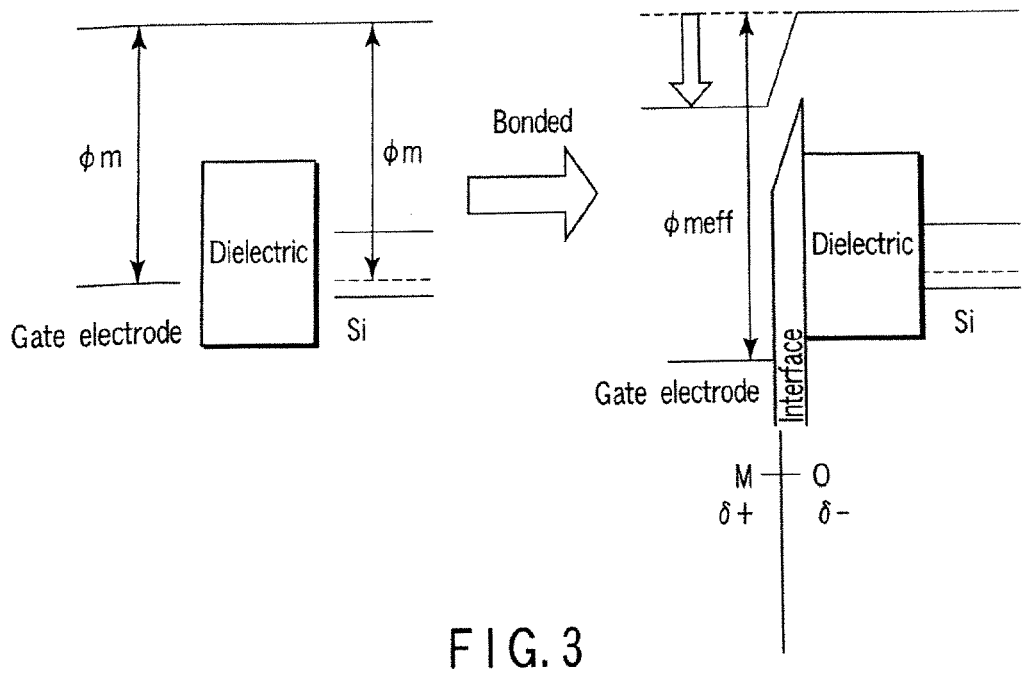
FIG. 3 is an energy band diagram when a dipole is formed at an interface between the gate electrode and a gate dielectric.

A principle of this will be explained below when the metal electrode is Ta by way of example. Ta and Hf have low binding energy and are thus difficult to create a bond. This is also obvious from that fact that no stable compound of Ta and Hf exists. On the other hand, Ta and O have high binding energy and are thus easier to create a bond than the combination of Ta and Hf. Thus, when the dielectric immediately under the metal electrode is an Hf-based oxide, a bond of Ta (M) in the metal electrode and O in the gate dielectric as shown in FIG. 3 is predominant at the interface between the metal gate electrode and the dielectric. Since Pauling's electronegativities of Ta and O are 1.5 and 3.5, respectively, a dipole δ+/δ− is formed at the interface between the metal gate electrode and the dielectric. When the atom on the dielectric side has higher electronegativity than that of the atom on the metal electrode side among the atoms which create bonds at the interface, the effective work function is modulated by the dipole to increase as shown in an energy bond diagram of FIG. 3. Therefore, the effective work function of Ta increases on an Hf oxide.

On the other hand, because the binding energy of Si and Ta is higher than that of Hf and Ta, a lot of bonds are created between Ta atoms in the electrode and Si atoms in the dielectric at the interface between the metal electrode and the dielectric, when the dielectric immediately under the metal electrode is SiO$_2$, Therefore, the bonds of Ta and O decrease as compared with a case where the dielectric is HfSiON. Since Pauling's electronegativities of Ta and Si are 1.5 and 1.8, respectively, the effective work function is again modulated to increase. However, the difference of electronegativity here is 0.3, which is lower than in the case of Ta and O having an electronegativity difference as high as 2.0. Thus, Ta maintains a work function intrinsic thereto on SiO$_2$, as compared with that on the Hf-based oxide. In this way, the effective work function of Ta varies on the Hf oxide and on SiO$_2$.

A difference in the effective work function dependent on the kind of dielectric which is caused by the dipole formed at the interface between the dielectric and the metal gate electrode is greater when the electronegativity of the metal atom of the electrode is lower. This is because when the electronegativity of the metal atom of the electrode is lower, the difference of the electronegativity between the metal atom and O or Si which combines with the metal atom becomes larger. If they are equally easy to achieve a covalent bond, the binding energy is higher with a larger difference in the electronegativity, and a bond is easily created. That is, when the electronegativity of the metal atom of the electrode is lower, the number of bonds formed at the interface between the metal electrode and the dielectric is greater, and an influence on the effective work function exerted by the dipole is greater. This is also apparent from that fact that a difference of the electronegativities on the Hf oxide and on $SiO_2$ is greater in a compound of La and Er which has a lower Pauling's electronegativity of 1.1, as compared with a difference of the electronegativities on the Hf oxide and on $SiO_2$ in Ta and a Ta compound with a Pauling's electronegativity of 1.5 in FIG. 2.

Furthermore, an advantage according to the embodiment of the present invention is provided by a large increase in the work function of the metal gate electrode on the pMISFET side. Therefore, the metal used for the gate electrode must originally have a low work function suitable for the nMISFET. That is, the metal used for the gate electrode 8 may be any metal as long as it has the low electronegativity and work function. Thus, the metal used for the gate electrode 8 is not limited to Ta, La, Er shown in FIG. 2, and may be any one of Zr, Hf, Ti, Ta, Sc, Y, Sc, Y and a lanthanoide and actinide sactinide series.

Moreover, the material of the gate electrode 8 is not limited to a metal simple substance such as Zr, Hf, Ti, Ta, Sc, Y, and the lanthanoide and actinide series, and may be a compound thereof. The metal compound has sufficiently high electron density, and can solve the problem of depletion of the gate electrode interface in the same manner as the metal simple substance. Further, in general, a compound is chemically stable as compared with the metal simple substance and has a high melting point, so that it can suppress a reaction between the metal gate electrode and the dielectric and improve heat resisting properties. However, a compound partner is limited in respect of electronegativity and work function.

Figure 4:
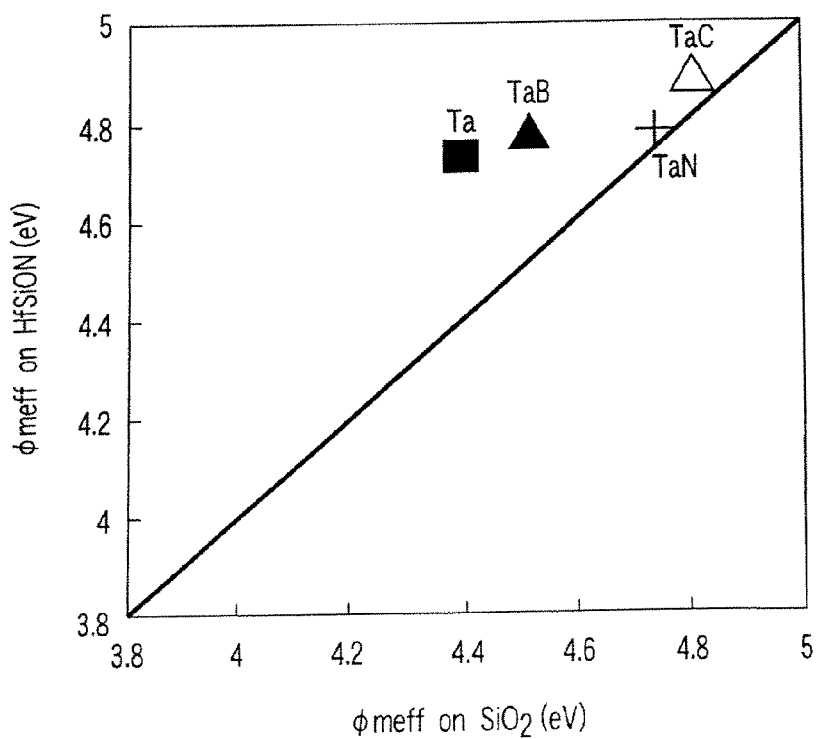
FIG. 4 is a graph showing an effective work function of a Ta simple substance and Ta compounds on HfSiON and SiO$_2$.

FIG. 4 shows the effective work function φmeff of Ta, TaB, TaN and TaC on HfSiON which is a high-k dielectric and on $SiO_2$. FIG. 5 shows the electronegativity dependency of the compound partner relative to the difference of the effective work function of the Ta compounds on HfSiON and $SiO_2$.

As understood from FIG. 4, TaN and TaC also have values of the effective work function of about 4.8 eV on $SiO_2$, and can not obtain a value substantially equal to that of the work function of a polysilicon electrode for an nMOSFET.

Furthermore, it is apparent from FIG. 5 that the difference in the effective work function dependent on the kind of dielectric is smaller when the electronegativity of the compound partner is higher. This is because the compound partner on the gate electrode side which has higher electronegativity than a metal atom in the dielectric combines with the metal atom in the dielectric at the interface to form a dipole δ−/δ+ as shown in FIG. 6 reverse to the dipole shown in FIG. 3. Its influence is naturally more obvious when the electronegativity of the compound partner is higher. As shown in FIG. 6, since the dipole reverse to that in FIG. 3 has an effect of decreasing the work function of the gate electrode, the effects of both dipoles are offset, with the result that an effect of the work function modulation by the dipole is reduced. That is, any compound partner may be used as long as it maintains the work function of the metal simple substance to a certain degree and has a certain low degree of electronegativity, and the kinds of compounds include boride, silicide and germanide.

As described above, the effective work function varies depending on the kind of dielectric due to the fact that a difference between the electronegativity of the metal atom of the gate electrode and the electronegativity of the atom on the dielectric side which combines with the metal atom varies regarding the nMISFET and the pMISFET. That is, when the metal atom of the gate electrode is the same, the difference of the effective work function of the gate electrode between the nMISFET and the pMISFET is greater if the electronegativity of the atom on the dielectric side which combines with the metal atom varies more greatly regarding the nMISFET and the pMISFET. O on the dielectric side mainly combines with metal atom of the electrode at the interface between the metal electrode and the dielectric of the pMISFET regardless of the kind of metal atom in the dielectric as long as the dielectric satisfies a condition for the gate dielectric 10. Thus, the atom on the dielectric side which combines with the metal atom of the electrode in the nMISFET desirably has electronegativity which greatly differs from that of O, that is, a low electronegativity. This means that when the electronegativity of the atom on the dielectric side which combines with the metal atom of the electrode in the nMISFET is lower, the effective work function of the metal electrode does not increase in the nMISFET and an original low work function is maintained.

From what has been described above, it is desired that an insulator containing the atom with high binding energy to combine with the metal atom of the gate electrode be on the gate electrode side (the gate dielectric 9) of the gate dielectric in the nMISFET, and an oxide containing the atom with low binding energy to combine with the metal atom of the gate electrode be on the gate electrode side of the gate dielectric in the pMISFET. As described above, the effect of this is higher when the electronegativity is lower with regard to the atom which is in the gate electrode side (the gate dielectric 9) of the gate dielectric in the nMISFET and which combines with the metal atom of the gate electrode. Consequently, the dielectric 9 is not limited to $SiO_2$ used in the example shown in FIG. 2, and may be any one of insulators containing Al, Si and Ge, such as AlN, AlON, $Al_2O_3$, $SiO_2$, SiN, SiON, $GeO_2$ or GeON. The gate dielectric 10 is not limited to the Hf oxide used in the example shown in FIG. 2 either, and may be any one of oxides containing at least one atom having lower binding energy to combine with the metal atoms of the gate electrode than Al, Si and Ge, such as Zr, Hf, Ti, Ta, Nb, V, Sc, Y and the lanthanoide and actinide series.

Furthermore, as described above, the degree of the effects according to the embodiment of the present invention is decided by a balance between the work functions and electronegativities of elements constituting the gate electrode and the gate dielectric. That is, the kind of dielectric which can provide the effects according to the embodiment of the present invention varies depending on the kind of the care electrode material and on the kind of the other dielectric, and the material can be suitably selected without departing from the spirit of the present invention.

For example, HfSiON used as the gate dielectric in the pMISFET in the example of FIG. 2 contains both Hf having low binding energy to combine with the metal atoms of the gate electrode and Si having high binding energy to combine with the metal atoms of the gate electrode, and therefore satisfies both conditions for the gate dielectric 9 and the gate dielectric 10. In the example shown in FIG. 2, the kind of the other dielectric is $SiO_2$ that does not at all contain Zr, Hf, Ti, Ta, Nb, V, Sc, Y and the lanthanoide and actinide series, which is a necessary condition for the gate dielectric 10. Therefore, it has relatively higher effective work function on HfSiON, and HfSiON functions as the dielectric of the pMISFET. That is, when the kind of the other dielectric is one such as $HfO_2$ that does not at all contain Al, Si and Ge which is a necessary condition for the gate dielectric 9, the effective work function on HfSiON is relatively low, and HfSiON functions as the dielectric of the nMISFET. At this time, an increase breadth of the effective work function of the nMISFET is larger as compared with a case where the dielectric is $SiO_2$, but a combination of such dielectrics is effective when the electrode material having work function lower than the ideal effective work function where there is no influence of dipole is used as the gate electrode.

As described above in detail, the satisfactory advantage according to the embodiment of the present invention can be provided when: the dielectric of at least the pMISFET is an oxide; there is a difference between atomic density of Zr, Hf, Ti, Ta, Nb, V, Sc, Y and the lanthanoide and actinide series contained in the dielectric of the pMISFET, and atomic density of Zr, Hf, Ti, Ta, Nb, V, Sc, Y and the lanthanoide and actinide series contained in the dielectric of the nMISFET; and a magnitude relation of the atomic densities is reverse to that of atomic densities of Al, Si and Ge between the pMISFET and the nMISFET. This is because in a case of a combination of the dielectrics satisfying such a condition, the fact that the atomic density of Zr, Hf, Ti, Ta, Nb, V, Sc, Y and the lanthanoide and actinide series is high means that the atomic density of Al, Si and Ge is low, so that more bonds of the electrode metal atom and O which have large difference in the electronegativity are formed and the effective work function increases. The dielectric, in which the atomic density of Zr, Hf, Ti, Ta, Nb, V, Sc, Y and the lanthanoide and actinide series is higher, that is, the atomic density of Al, Si and Ge is lower, functions as the dielectric of the pMISFET. The dielectric, in which the atomic density of Zr, Hf, Ti, Ta, Nb, V, Sc, Y and the lanthanoide and actinide series is lower, that is, the atomic density of Al, Si and Ge is higher, functions as the dielectric of the nMISFET. In this case, in order to obtain a sufficiently high effect, the atomic density of Zr, Hf, Ti, Ta, Nb, V, Sc, Y and the lanthanoide and actinide series contained in the dielectric of the nMISFET is desirably 50% or less of the atomic density of Zr, Hf, Ti, Ta, Nb, V, Sc, Y and the lanthanoide and actinide series contained in the dielectric of the pMISFET.

In this way, the effective work function of the pMISFET and the nMISFET can be optimized considering not only the difference in the kind of elements constituting the dielectrics of the pMISFET and the nMISFET but also the difference in the atomic density therebetween.

The dielectric 9 and the dielectric 10 referred to below include a dielectric that satisfies both conditions for the dielectric 9 and the dielectric 10, if the combination of dielectric satisfies the above-mentioned condition for the difference in the atomic density.

In this manner, a suitable combination of materials is used to form the gate electrode side of the gate dielectric of the pMISFET and the nMISFET gate dielectric 10 and 9) and the gate dielectric side of the gate electrode (the gate electrode 8), so that even when the gate electrodes of the pMISFET and the nMISFET are formed of the same metal, it can have different effective work functions suitable for the pMISFET and the nMISFET, and by forming a configuration as shown in FIG. 1, it is possible to realize the dual work function CMIS with a single metal gate electrode.

The advantage of the present invention is provided by the dipole which is formed in accordance with the difference of the electronegativities when two atoms are bonded at the interface between the gate electrode and the gate dielectric. When a dipole due to deviation of charges of +q and −q is formed by the atomic bond at the interface between the electrode and the dielectric and the dipole number is constant, a work function variation $\Delta\Phi$ due to this dipole is expressed as follows:

$$\Delta\Phi \propto qD \quad (1)$$

wherein D is a sum (Å) of atomic radii of the two bonded atoms. The deviation of charges increases with an electronegativity difference $\Delta\chi$, and consequently, the work function variation $\Delta\Phi$ is proportionate to a product of the electronegativity difference $\Delta\chi$ and the sum D of the atomic radii. Here, Equation (1) can be written as follows:

$$\Delta\Phi = k \times \Delta\chi \times D \quad (2)$$

wherein it is defined that $\Delta\chi = \chi$ (the element of the gate dielectric) $-\chi$ (a metal element of the gate electrode). K is a certain coefficient.

On the other hand, a metal element (element A) of the electrode 8 combines with an element (element B) having the highest binding energy to combine with the element A among elements constituting the dielectric 10. That is, it is necessary to consider here the electronegativity difference between the two elements and the sum of the atomic radii thereof. Accordingly, it is required to know what degree of $\Delta\chi \times D$ enables the sufficient work function variation $\Delta\Phi$. In the case as shown in FIG. 2 where the metal electrode is Ta, a high effective work function of about 4.8 eV is obtained by the dipole formed by bonding of Ta and O. Here, a vacuum work function (work function not influenced by the dipole) of Ta which we used was 4.25 eV. That is, a work function variation of about +0.55 eV is obtained by the dipole. The electronegativities of Ta and O are 1.5 and 3.5, respectively, and the atomic radii thereof are 1.43 Å and 0.61 Å, so that if these are substituted in Equation (2), $$0.55 = k \times 2 \times 2.04 \quad (3)$$

and it is therefore possible to obtain a relational expression:

$$\Delta\Phi = 0.13 \times \Delta\chi \times D \quad (4)$$

In general, the work function of the gate electrode of the pMISFET needs to be about 0.4 eV higher than the work function of the gate electrode of the nMISFET. However, a certain amount of increase in the work function is also expected on the nMISFET side, but a combination of materials is selected on the nMISFET side so that the work function increase is less than 0.1 eV even if the work function increase is at the maximum. Therefore, it is desired that a work function variation of +0.5 eV or more be obtained on the pMISFET side.

In this manner, the advantage of the present invention can be provided if $$(\chi B - \chi A) \times (d_A + d_B) \geq 0.5/0.13 \approx 3.9 \quad (5)$$

is satisfied, wherein $\chi A$ is the electronegativity of the metal element (element A) of the electrode 8, and $\chi B$ is the electronegativity of the element (element B) having the highest binding energy to combine with the element A among the elements constituting the dielectric 10, and the atomic radii of the element A and the element B are $d_A$, $d_B$, respectively.

On the other hand, since a minimum value of the work function variation on the pMISFET side is set to +0.5 eV, the advantage of the present invention can be provided if an increase in the work function in the nMISFET is less than 0.1 eV. That is, an element (element C) having the highest binding energy to combine with the metal element (element A) of the gate electrode 8 among the elements constituting the dielectric 9 of the nMISFET may be any element as long as it satisfies $$(\chi_C - \chi_A) \times (d_A + d_C) < 0.1 / 0.13 \approx 0.7 \quad (6)$$

wherein $\chi_C$ and $d_C$ are the electronegativity and atomic radius of the element C, respectively. It is to be noted that the effect of the dipoles is greater when the number of the atoms which combine at the interface and the number of dipoles are larger, so that it is possible to control the effective work function modulation by changing the atomic density at the interface.

Because the advantage of the present invention is derived from the fact that the effective work function is increased by the dipole formed at the interface between the gate electrode and the gate dielectric, the metal used for the gate electrode must be originally usable as the electrode of the nMISFET, and needs to have a low work function of 4.4 eV or less.

On the other hand, it is known that the work function $\Phi$ is strongly dependent on the electronegativity $\chi$ and that the relation therebetween is experientially described as follows:

$$\Phi = 2.27\chi + 0.34 \quad (7)$$

According to this, if the electronegativity $\chi$ is 1.78 or less, the work function $\Phi$ is 4.4 eV or less. Therefore, the electronegativity $\chi$ of the metal used for the gate electrode is desirably 1.78 or less.

The material of the gate electrode is not limited to the metal simple substance, and may be a metal compound. However, the elements constituting the compound is restricted in that the work function of the compound must have a value suitable for the gate electrode of the nMISFET. While the work function of the metal is dependent on its electronegativity as described above, but the electronegativity $\chi$(compound) of a compound $A_m X_n$ is generally described as follows:

$$\chi(\text{compound}) = {}^{m+n}\sqrt{\chi_A{}^m \chi_X{}^n} \quad (8)$$

wherein $\chi_x$ is the electronegativity of an element X.

That is, the metal compound may be any compound as long as it satisfies $$\chi(\text{compound}) \leq 1.78 \quad (9)$$

For example, when the metal electrode as shown in FIG. 2 is TaB, the electronegativity of B is 2.0, so that $$\chi(\text{compound}) = {}^2\sqrt{1.5 \times 2.0} = 1.73$$

and this satisfies Equation (9).

(Second Embodiment)

Figure 7:
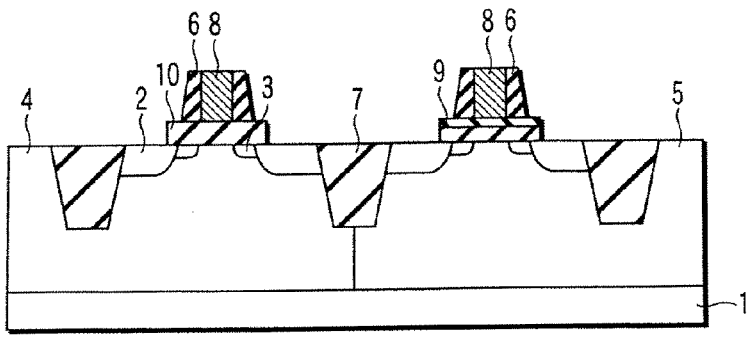
FIG. 7 is a sectional view of a semiconductor device according to a second embodiment of the present invention.
Figure 8:
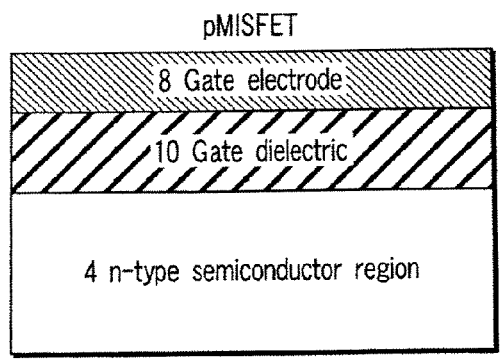
FIG. 8 is a schematic enlarged sectional view of a pMISFET in the semiconductor device according to the second embodiment.

FIG. 7 is a sectional view of a semiconductor device according to a second embodiment of the present invention. FIG. 8 is a schematic enlarged sectional view of an Si substrate, a gate dielectric and a gate electrode of a pMISFET in the semiconductor device of FIG. 7. A gate dielectric made of an oxide 10 is formed on an n-type Si substrate 4. A gate electrode 8 is formed on the gate dielectric 10. Although not shown, a refractory metal such as W or the like may further be formed on the gate electrode 8.

Figure 9:
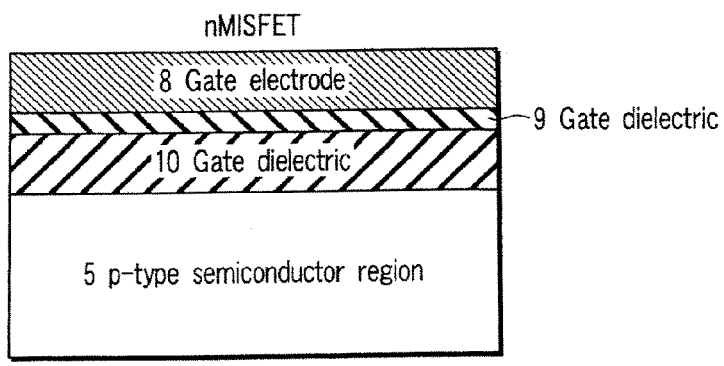
FIG. 9 is a schematic enlarged sectional view of an nMISFET in the semiconductor device according to the second embodiment.

FIG. 9 is a schematic enlarged sectional view of an Si substrate, a gate dielectric and a gate electrode of an nMISFET in the semiconductor device of FIG. 7. A gate dielectric is formed on a p-type Si substrate. The second embodiment is different from the first embodiment in that the gate dielectric has a laminated structure, and a lower layer thereof includes the oxide on which a dielectric 9 different from the lower layer is formed, as understood from FIG. 9. Other configurations are similar to those in the first embodiment and are not described in detail.

As described in the first embodiment, since an advantage of the embodiment is caused by a dipole formed at an interface between the gate electrode and the gate dielectric, a thickness of the gate dielectric 9 is not limited, and the gate dielectric 9 may be any gate dielectric as long as it is one or more monolayers between the metal electrode and the oxide film 10. The dielectric 9 needs to be as thin as possible to reduce a decrease in gate capacitance to the minimum, and more particularly, the dielectric 9 is desirably one or more monolayers and 2 nm or less.

The gate electrode 8 is formed on the gate dielectric 9. A refractory metal such as W or the like may further be formed on the gate electrode 8.

Figure 10:
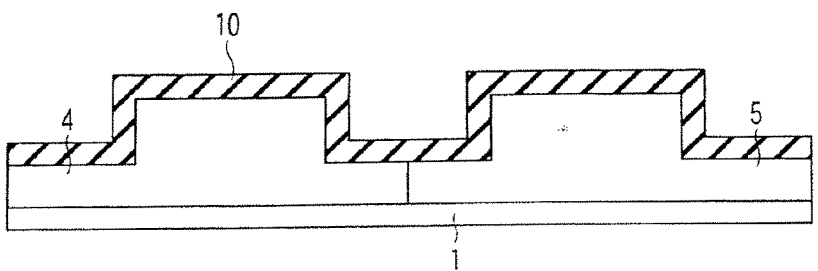

A method of manufacturing the semiconductor device according to the second embodiment will next be described referring to FIGS. 10 to 13. First, a region for isolation is formed in an Si substrate 1 by a shallow trench method as shown in FIG. 10, and element formation plan regions are separated. Next, the n-type semiconductor region 4 and a p-type semiconductor region 5 are formed, and then the gate dielectric 10 is formed on a substrate surface. Subsequently, the gate dielectric 9 is selectively deposited only on the gate dielectric 10 on the nMISFET side as shown in FIG. 11. The gate dielectric 9 is desirably as thin as possible to reduce a decrease in the gate capacitance to the minimum. A method of depositing the gate dielectric 9 is not specifically limited, but it is desirable to use, for example, an atomic layer deposition (ALD) method capable of forming a uniform thin film.

Next, the same metal gate material is deposited on the gate dielectric 10 and the gate dielectric 9 as shown in FIG. 12, and the gate electrodes 8 of the nMISFET and pMISFET are simultaneously formed. Methods of the film formation include, for example, a chemical vapor deposition (CVD) method, a vapor deposition method and a sputter method. Subsequently, the gate electrode and the gate dielectric are processed by etching such as lithography and RIE as shown in FIG. 13.

An isolation region 7, a source/drain region 2, an extension region 3 and a sidewall dielectric 6 can be formed by properly using an ordinary semiconductor process after or during the process described above.

In a configuration shown in FIG. 7, the gate electrode is the same for the nMISFET and the pMISFET, and it is therefore not necessary to individually produce the gate electrodes unlike conventional gate electrodes which are different in the pMISFET and the nMISFET. Further, when the gate dielectric 9 may be very thin as in the present structure, gate processing can be performed in one etching step even if the gate dielectric is differently structured in the pMISFET and the nMISFET. Therefore, according to the embodiment of the present invention, it is possible to manufacture a dual work function CMIS using the metal gate by a simple process.

Furthermore, a transistor in which the gate is formed by means of the prior art where the gate is formed in advance has been described in the above embodiment, but the present invention is also applicable to a transistor in which the gate is formed by use of so-called damascene method considering heat resistance properties of the metal gate.

It is to be noted that the manufacturing method is not described in the first embodiment, but the first embodiment is only different from the second embodiment in that the gate dielectric is a monolayer, so that the first embodiment can be similarly implemented by adapting the gate dielectric formation step in the second embodiment for the monolayer.

The second embodiment described above can provide a similar advantage by a function similar to that in the first embodiment.

(Third Embodiment)

Figure 14:
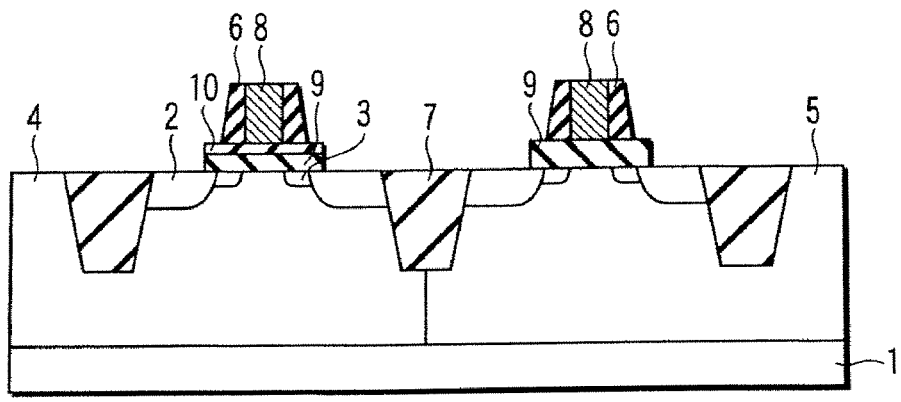
FIG. 14 is a sectional view of a semiconductor device according to a third embodiment of the present invention.
Figure 15:
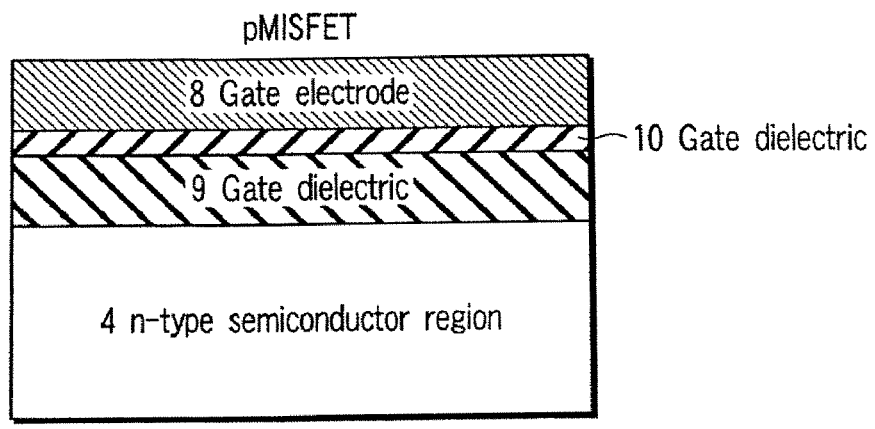
FIG. 15 is a schematic enlarged sectional view of a pMISFET in the semiconductor device according to the third embodiment.

FIG. 14 is a sectional view of a semiconductor device according to a third embodiment of the present invention. FIG. 15 is a schematic enlarged sectional view of an Si substrate, a gate dielectric and a gate electrode of a pMISFET in the semiconductor device of FIG. 14. A gate dielectric is formed on an n-type semiconductor region 4. The gate dielectric has a laminated structure, and a lower layer thereof is a dielectric 9. A dielectric 10 different from the lower layer is formed on the dielectric 9, and this is different from the first embodiment.

As described in the first embodiment, since a difference in the effective work function is caused by a dipole formed at an interface between the gate electrode and the gate dielectric, a thickness of the gate dielectric 10 is not limited, and the dielectric 10 may be any dielectric as long as it is one or more monolayers between the metal electrode and the oxide film 10. The gate dielectric 10 needs to be as thin as possible to reduce a decrease in gate capacitance to the minimum, and more particularly, the dielectric 10 is desirably one or more monolayers and 2 nm or less. A refractory metal such as W or the like may further be formed on the gate electrode 8.

Figure 16:
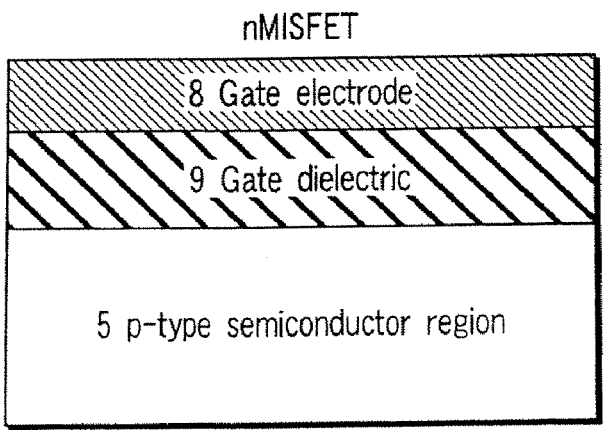
FIG. 16 is a schematic enlarged sectional view of an nMISFET in the semiconductor device according to the third embodiment.

FIG. 16 is a schematic enlarged sectional view of an Si substrate, a gate dielectric and a gate electrode of an nMISFET in the semiconductor device of FIG. 14. A gate dielectric made of an oxide 9 is formed on a p-type semiconductor region 5. The gate electrode 8 is formed on the gate dielectric 9. A refractory metal such as W or the like may further be formed on the gate electrode 8.

A method of manufacturing the semiconductor device of the third embodiment is only different from that in the second embodiment in that a place and a material to form the laminated gate dielectric are different, and the third embodiment can therefore be implemented in the same manner as the second embodiment. In addition, the semiconductor device in the third embodiment can provide a similar advantage by a function similar to those in the first and second embodiments described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method of manufacturing a semiconductor device, comprising:
    forming an n-type semiconductor region and a p-type semiconductor region on a semiconductor substrate;
    forming a first gate dielectric layer above the n-type semiconductor region;
    forming a second gate dielectric layer above the p-type semiconductor region, the second gate dielectric layer having a composition different from that of the first gate dielectric layer; and
    forming a gate electrode layer over the n-type semiconductor region and the p-typesemiconductor region, after said forming a first gate dielectric layer and said forming a second gate dielectric layer,
    such that a portion of the first gate dielectric layer in contact with the gate electrode layer and a portion of the second gate dielectric layer in contact with the gate electrode layer include oxygen, a first element of at least one element selected from the group consisting of Zr, Hf, Ti, Ta, Nb, V, Sc, Y, a lanthanoide series and a actinide series, and
    said forming a gate electrode layer over the n-type semiconductor region and the p-type semiconductor region includes making the atomic density of the first element in the portion of the second gate dielectric layer be lower than the atomic density of the first element in the portion of the first gate dielectric layer.

2. The method according to claim 1, wherein said forming a second gate dielectric layer includes forming the second gate dielectric layer with a second element including one selected from the group consisting of Al, Si and Ge.

3. The method according to claim 1, further comprising:
    removing the first gate dielectric layer on the p-type semiconductor region, after said forming a first gate dielectric layer and before said forming a second gate dielectric layer.

4. The method according to claim 3, further comprising:
    forming a first gate electrode above the n-type semiconductor region and a second gate electrode above the p-type semiconductor region, by selectively etching the gate electrode layer.

5. The method according to claim 4, further comprising:
    forming an insulating layer over the p-type semiconductor region and the n-type semiconductor region to bury the first gate electrode and the second gate electrode, after said forming the first gate electrode and the second gate electrode; and
    flatly etching back the insulating layer to expose tops of the first gate electrode and the second gate electrode.

6. The method according to claim 1, wherein said forming a second gate dielectric layer above the p-type semiconductor region includes forming the second gate dielectric layer above the p-type semiconductor region with the first gate dielectric layer interposed therebetween.

7. The method according to claim 6, further comprising:
    forming a first gate electrode above the n-type semiconductor region and a second gate electrode above the p-type semiconductor region, by selectively etching the gate electrode layer.

8. The method according to claim 7, further comprising:
    forming an insulating layer over the n-type semiconductor region and the p-type semiconductor region to bury the first gate electrode and the second gate electrode, after said forming the first gate electrode and the second gate electrode; and
    flatly etching back the insulating layer to expose tops of the first gate electrode and the second gate electrode.

9. The method according to claim 6, wherein said forming a second gate dielectric layer above the p-type semiconductor region includes forming the second gate dielectric layer so as to have a thickness of one or more mono layers and 2 nm or less.

10. The method according to claim 1, wherein said forming a gate electrode layer includes forming the gate electrode layer such that a relation:

$$(\chi B - \chi A) \times (d_A + d_B) \geq 3.9$$

is satisfied by electronegativity ($\chi A$) and an atomic radius ($d_A$, a unit thereof is Å) of a metal element constituting the gate electrode layer and by electronegativity ($\chi B$) and an atomic radius ($d_B$) of an element having the highest binding energy to combine with the metal element constituting the gate electrode layer among elements constituting the portion of the first gate dielectric layer facing the gate electrode layer.

11. The method according to claim 10, wherein said forming a gate electrode layer includes forming the gate electrode layer such that a relation:

$$(\chi C - \chi A) \times (d_A + d_C) \leq 0.7$$

is satisfied, wherein $\chi C$ and $d_C$ (a unit thereof is Å) are electronegativity and an atomic radius of an element having the highest binding energy to combine with the metal element constituting the gate electrode layer among elements constituting the portion of the second gate dielectric layer above the p-type semiconductor region facing the gate electrode layer.

12. The method according to claim 1, wherein said forming a gate electrode layer over the n-type semiconductor region and the p-type semiconductor region, after said forming a first gate dielectric layer and said forming a second gate dielectric layer, includes making the atomic density of the first element contained in the second gate dielectric layer be 50% or less of atomic density of the first element contained in the first gate dielectric layer.

13. The method according to claim 1, wherein said forming a gate electrode layer over the n-type semiconductor region and the p-type semiconductor region, after said forming a first gate dielectric layer and said forming a second gate dielectric layer, includes making a portion of the first gate electrode layer in contact with the first gate dielectric layer and a portion of the second gate electrode layer in contact with the second gate dielectric layer include the same metal element.

14. The method according to claim 1, wherein said forming a gate electrode layer over the n-type semiconductor region and the p-type semiconductor region, after said forming a first gate dielectric layer and said forming a second gate dielectric layer, includes making a portion of the first gate electrode layer in contact with the first gate dielectric layer and a portion of the second gate electrode layer in contact with the second pate dielectric layer include at least one metal element selected from the group consisting of Ta, La, Er, Zr, Hf, Ti and La.

15. A method of manufacturing a semiconductor device, comprising:
    forming an n-type semiconductor region and a p-type semiconductor region on a semiconductor substrate;
    forming a second gate dielectric layer above the n-type semiconductor region and the p-type semiconductor region;
    forming a first gate dielectric layer above the n-type semiconductor region, the first gate dielectric layer being made of an insulating material different from that of the second gate dielectric layer, the first gate dielectric layer and the second gate dielectric layer being formed of an oxide layer including a first element of at least one metal element selected from the group consisting of Zr, Hf, Ti, Ta, Nb, V, Sc, Y, a lanthanoide series and a actinide series; and
    forming a gate electrode layer over the n-type semiconductor region and the p-type semiconductor region, after said forming a first gate dielectric layer and said forming a second gate dielectric layer, wherein an atomic density of the first element in a portion of the second pate dielectric layer in contact with the gate electrode layer is lower than an atomic density of the first element in a portion of the first pate dielectric layer in contact with the gate electrode layer.

16. The method according to claim 15, wherein said forming a second gate dielectric layer includes forming the second gate dielectric layer with a material including one selected from the group consisting of Al, Si and Ge.

17. The method according to claim 15, wherein said forming a first gate dielectric layer above the n-type semiconductor region includes forming the first gate dielectric layer above the n-type semiconductor region with the second gate dielectric layer interposed therebetween.

18. The method according to claim 17, further comprising:
    forming a first gate electrode above the n-type semiconductor region and a second gate electrode above the p-type semiconductor region, by selectively etching the gate electrode layer.

19. The method according to claim 18, further comprising:
    forming an insulating layer over the n-type semiconductor region and the p-type semiconductor region to bury the first gate electrode and the second gate electrode, after said forming the first gate electrode and the second gate electrode; and
    flatly etching back the insulating layer to expose tops of the first gate electrode and the second gate electrode.

20. The method according to claim 17, wherein said forming a first gate dielectric layer above the n-type semiconductor region includes forming the first gate dielectric layer so as to have a thickness of one or more mono layers and 2 nm or less.

21. The method according to claim 15, wherein said forming a gate electrode layer includes forming the gate electrode layer such that a relation:

$$(\chi B - \chi A) \times (d_A + d_B) \geq 3.9$$

is satisfied by electronegativity ($\chi A$) and an atomic radius ($d_A$, a unit thereof is Å) of a metal element constituting the gate electrode layer and by electronegativity ($\chi B$) and an atomic radius ($d_B$) of an element having the highest binding energy to combine with the metal element constituting the gate electrode layer among elements constituting the portion of the first gate dielectric layer facing the gate electrode layer.

22. The method according to claim 21, wherein said forming a gate electrode layer includes forming the gate electrode layer such that a relation:

$$(\chi C - \chi A) \times (d_A + d_C) \leq 0.7$$

is satisfied, wherein $\chi C$ and $d_C$ (a unit thereof is Å) are electronegativity and an atomic radius of an element having the highest binding energy to combine with the metal element constituting the gate electrode layer among elements constituting the portion of the second gate dielectric layer above the p-type semiconductor region facing the gate electrode layer.

* * * * *

UNITED STATES PATENT AND TRADEMARK OFFICE
CERTIFICATE OF CORRECTION

PATENT NO. : 8,304,304 B2
APPLICATION NO. : 13/184116
DATED : November 6, 2012
INVENTOR(S) : Ichihara et al.

Page 1 of 1

It is certified that error appears in the above-identified patent and that said Letters Patent is hereby corrected as shown below:

Claim 1, column 11, line 62, change "p-typesemiconductor" to --p-type semiconductor--.

Signed and Sealed this
Fifth Day of February, 2013

Teresa Stanek Rea
*Acting Director of the United States Patent and Trademark Office*